US009690881B2

(12) United States Patent
Martinez Canedo et al.

(10) Patent No.: US 9,690,881 B2
(45) Date of Patent: Jun. 27, 2017

(54) SYNCHRONIZATION AND AUTOMATIC CODE GENERATION OF 3D AND 1D MODELS USING FUNCTIONAL MODELING

(71) Applicant: Siemens Product Lifecycle Management Software Inc., Plano, TX (US)

(72) Inventors: Arquimedes Martinez Canedo, Princeton, NJ (US); Martin Witte, Schwabach (DE); Peter Hutchison, Cambridge (GB); Karel Dewilde, Zandbergen (BE)

(73) Assignee: SIEMENS PRODUCT LIFECYCLE MANAGEMENT SOFTWARE INC., Plano, TX (US)

( * ) Notice: Subject to any disclaimer, the term of this patent is extended or adjusted under 35 U.S.C. 154(b) by 621 days.

(21) Appl. No.: 14/219,138

(22) Filed: Mar. 19, 2014

(65) Prior Publication Data
US 2015/0025854 A1    Jan. 22, 2015

Related U.S. Application Data

(60) Provisional application No. 61/846,722, filed on Jul. 16, 2013.

(51) Int. Cl.
*G06F 17/50*     (2006.01)
*G06T 17/00*     (2006.01)
(52) U.S. Cl.
CPC ............ *G06F 17/50* (2013.01); *G06T 17/005* (2013.01)

(58) Field of Classification Search
CPC .............................. G06F 17/50; G06T 17/005
See application file for complete search history.

(56) References Cited

U.S. PATENT DOCUMENTS

| 6,779,002 B1* | 8/2004 | Mwaura ............ G06F 17/30575 |
| 7,292,964 B1 | 11/2007 | Mukherjee et al. |
| 8,510,088 B2 | 8/2013 | Rousseau et al. |
| 2014/0019104 A1 | 1/2014 | Martinez Canedo et al. |

OTHER PUBLICATIONS

Hitoshi Komoto et al., "A framework for computer-aided conceptual design and its application to system architecting of mechatronics products," 2012, Computer-Aided Design, vol. 44, pp. 931-946.*

(Continued)

*Primary Examiner* — Kamini S Shah
*Assistant Examiner* — Russ Guill

(57) ABSTRACT

Methods for product data management and corresponding systems and computer-readable mediums. A method includes receiving and parsing a functional model to produce a functional model graph, and receiving and parsing a three-dimensional (3D) model that corresponds to the functional model to produce a 3D model graph. The method includes identifying a plurality of one-dimensional (1D) candidate components corresponding to the functional model graph and the 3D model graph. The method includes creating a 1D graph corresponding to the 1D candidate components, parameterizing the 1D components in the 1D graph, and generating a 1D model from the parameterized 1D components.

17 Claims, 16 Drawing Sheets

(56) References Cited

OTHER PUBLICATIONS

Benjamin Kruse et al., "A model-based functional modeling and library approach for mechatronic systems in sysml," Aug. 12, 2012, Proceedings of the ASME 2102 International Design Engineering Technical Conferences & Computers and Information in Engineering Conference, pp. 1-11.*

Bergen Helms, "Object-oriented graph grammars for computational design synthesis," Mar. 2013, Technischen Universität München, 179 pages.*

Alex c. Starling, "Performance-based computational synthesis of parametric mechanical systems," 2004, Cambridge University, 220 pages.*

Benjamin Kruse et al., "Workflow and modeling conventions for function and product structure modeling of mechatronic systems in SysML using libraries," Sep. 17, 2012, The 13th Mechatronics Forum 2012, pp. 506-513.*

Tolga Kurtoglu et al., "Autometed synthesis of electromechanical design configurations from empirical analysis of function to form mapping," 2009, Journal of Engineering Design vol. 20, No. 1, 20 pages.*

P. Bhattacharya, N. S. Welakwe, R. Makanaboyina, & A. Chimalakonda, "Integration of CATIA with Modelica," Proceedings of the 5th Modelica Conf., Sep. 2006, pp. 671-675 (5pgs).

P. Bunus, V. Engelson, et al, "Mechanical Models Translation, Simulation and Visualization in Modelica," Proceedings of the Modelica Workshop, Oct. 2000, pp. 199-208 (10pgs).

H. Elmqvist, et al., "Redundancies in Multibody Systems and Automatic Coupling of CATIA and Modelica," Proceedings of the 7th Modelica Conf., Sep. 2009, pp. 551-560 (10 pgs).

AVL, "Advanced Simulation Technologies," Excite to Cruise, https://www.avl.com/web/ast/transmission-and-driveline, retrieved Mar. 5, 2014, (1 page).

VI-Grade, "Climbing the Peaks of System-Level Simulation," http://www.vi-grade.com/, retrieved Mar. 5, 2014, (1 page).

Carsim, "Mechanical Simulation," http://www.carsim.com/, retrieved Mar. 5, 2014, 1 page.

Stone, Robert B., et al, Development of a Functional Basis for Design, Dev'l of a Functional Basis for Design Accepted to J. of Mech. Design, 2000 (36 pages).*

* cited by examiner

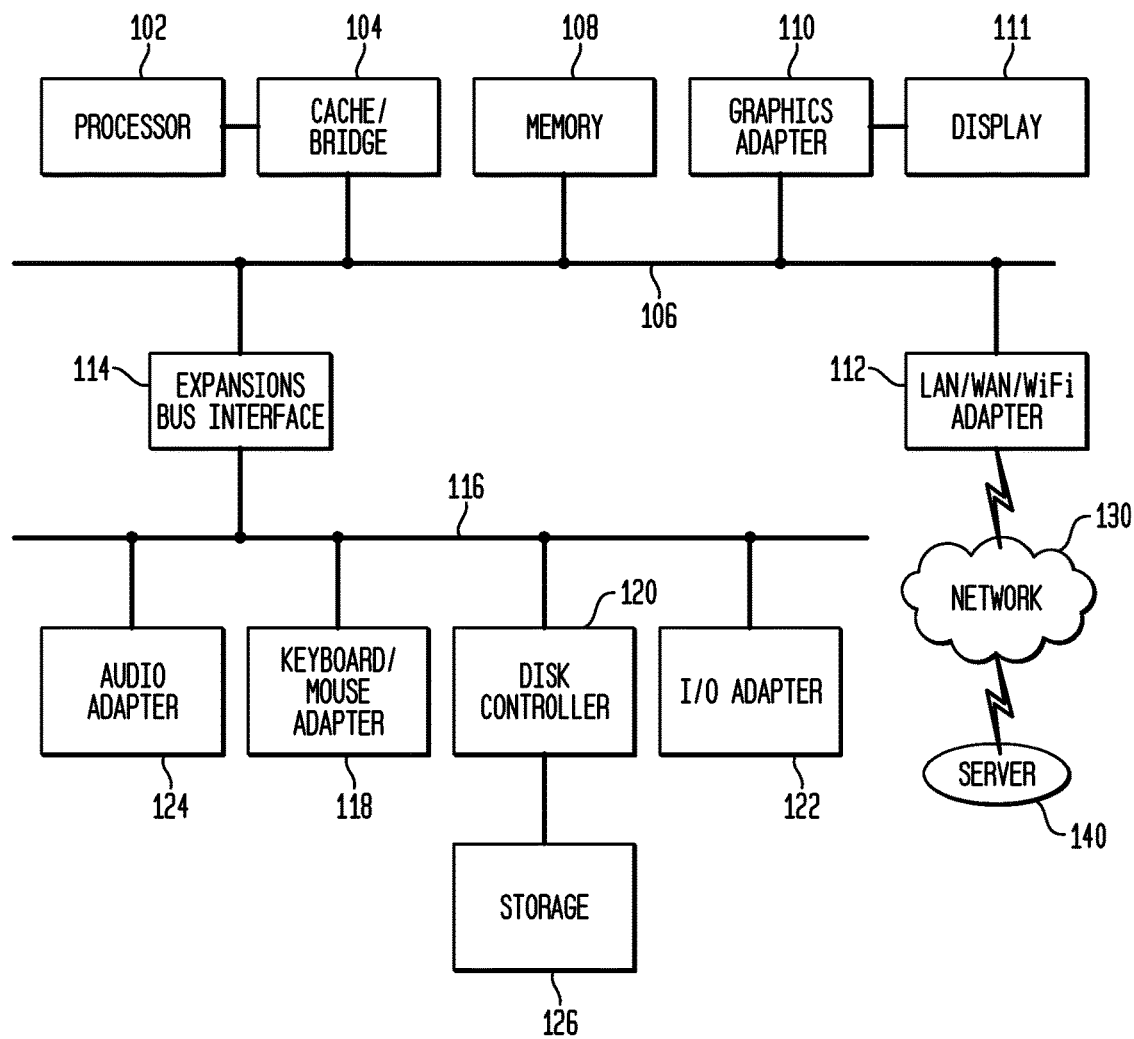

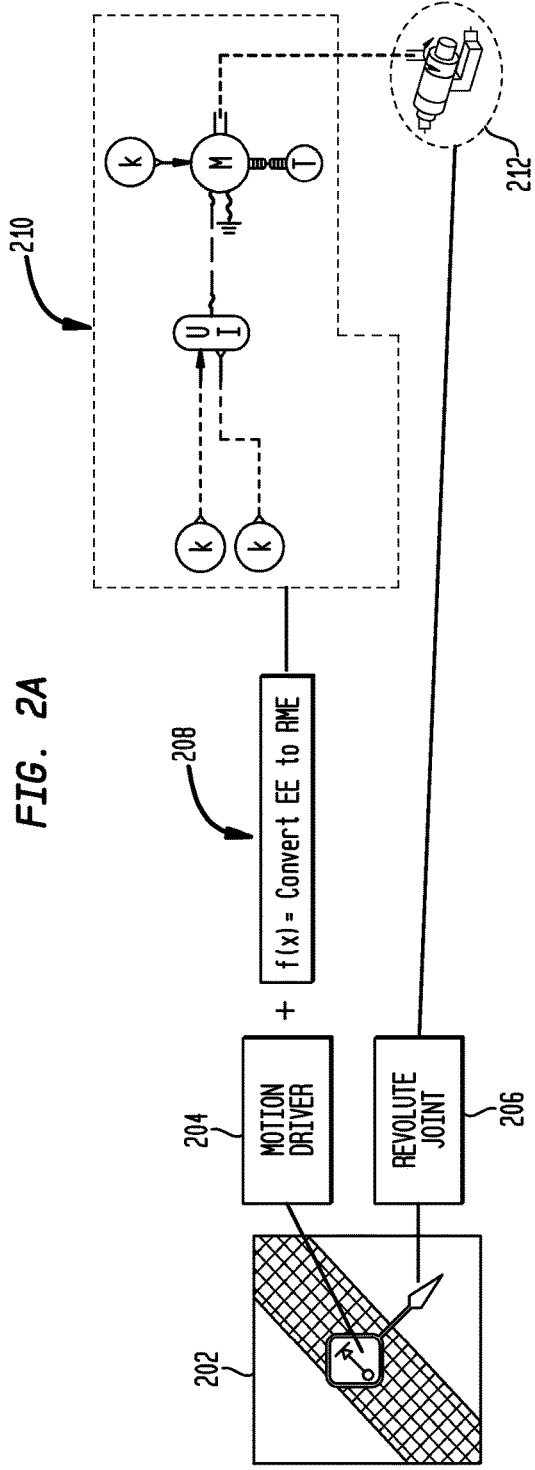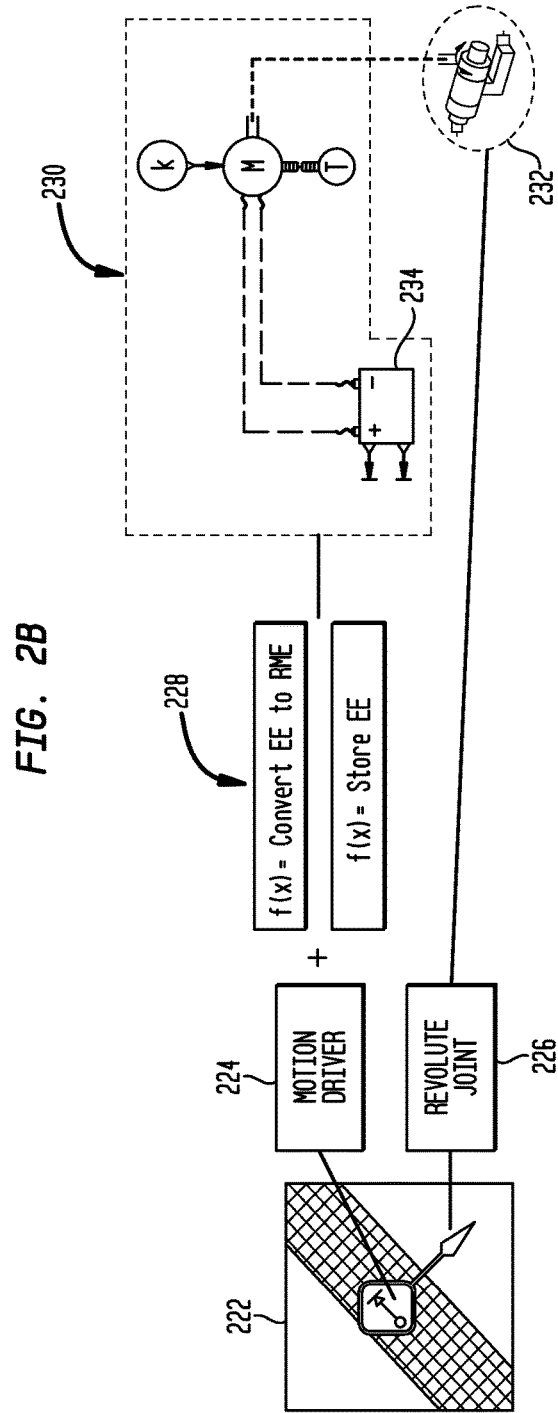

FIG. 3B

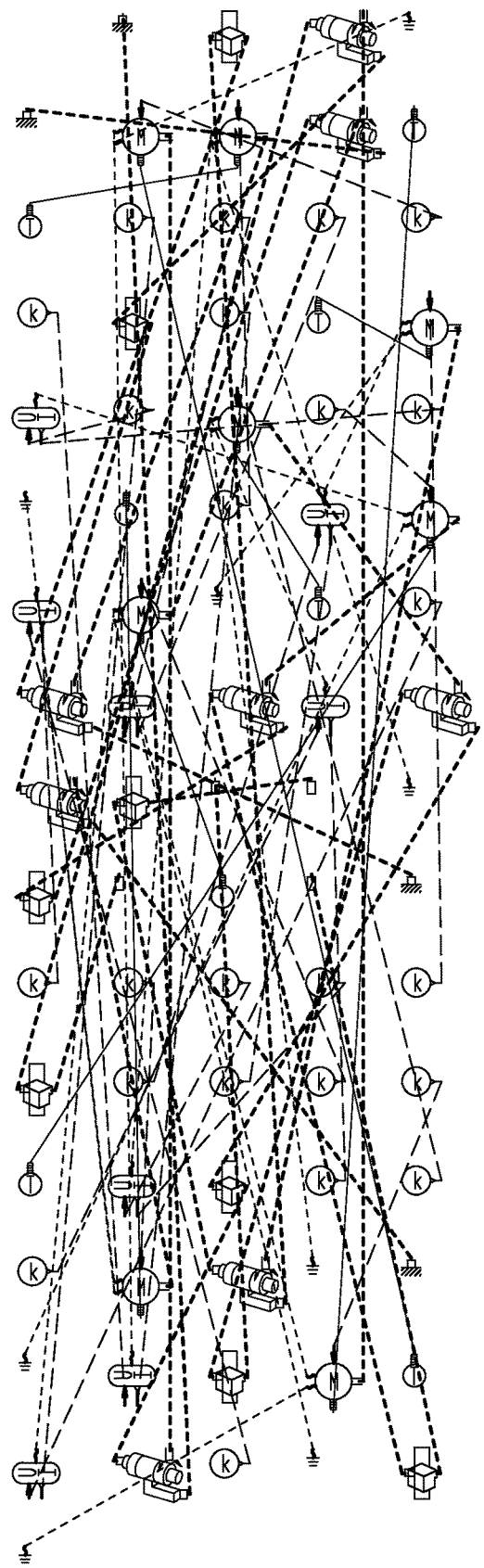

| Solution2 |
| --- |
| Electricity 2 Signal |
| drv_elec2sig120 |
| drv_elec2sig137 |
| drv_elec2sig179 |
| drv_elec2sig162 |
| drv_elec2sig128 |
| drv_elec2sig171 |
| drv_elec2sig154 |
| drv_elec2sig145 |
| Electric Motors |
| drv_electricmotortherm_31 |
| drv_electricmotortherm_22 |
| drv_electricmotortherm_14 |
| drv_electricmotortherm_48 |
| drv_electricmotortherm_73 |
| drv_electricmotortherm_39 |
| drv_electricmotortherm_56 |
| drv_electricmotortherm_65 |
| Electric Grounds |
| drv_pot_ref_19 |
| drv_pot_ref_70 |
| drv_pot_ref_53 |
| drv_pot_ref_61 |
| drv_pot_ref_27 |
| drv_pot_ref_78 |
| drv_pot_ref_36 |
| drv_pot_ref_44 |
| Zero Forces |
| Grounds |
| Bodies |
| Joints |
| Temperature Sources |
| th_temperature_source_60 |
| th_temperature_source_18 |
| th_temperature_source_26 |
| th_temperature_source_52 |
| th_temperature_source_69 |
| th_temperature_source_77 |
| th_temperature_source_43 |
| th_temperature_source_35 |
| Constants |

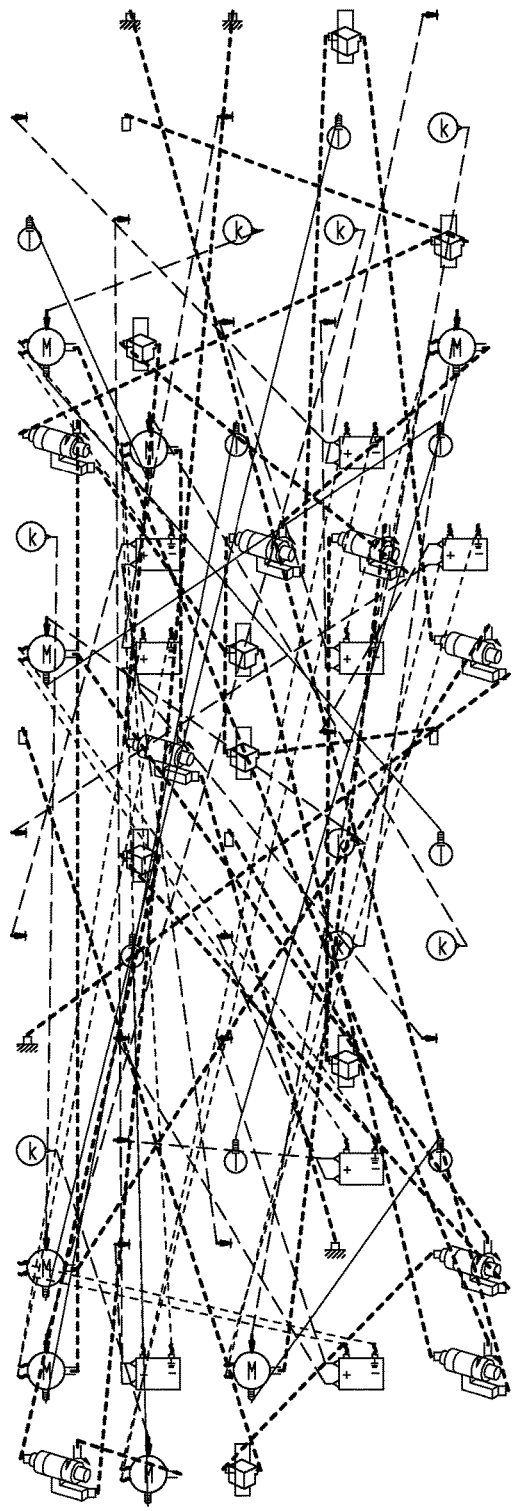

- Solution3
  - Zero Forces
  - Signal Sinks
  - Batteries
    - drv_battery_17  ← 312
    - drv_battery_24
    - drv_battery_47
    - drv_battery_54
    - drv_battery_69
    - drv_battery_32
    - drv_battery_62
    - drv_battery_39
  - Electric Motors
    - drv_electricmotortherm_59
    - drv_electricmotortherm_36
    - drv_electricmotortherm_21
    - drv_electricmotortherm_14
    - drv_electricmotortherm_44
    - drv_electricmotortherm_51
    - drv_electricmotortherm_29
    - drv_electricmotortherm_66
  - Grounds
  - Bodies
  - Joints
  - Temperature Sources
  - Constants

310

SYNCHRONIZATION AND AUTOMATIC CODE GENERATION OF 3D AND 1D MODELS USING FUNCTIONAL MODELING

CROSS-REFERENCE TO OTHER APPLICATION

This application claims the benefit of the filing date of U.S. Provisional Patent Application 61/846,722, filed Jul. 16, 2013, which is hereby incorporated by reference.

TECHNICAL FIELD

The present disclosure is directed, in general, to computer-aided design, visualization, and manufacturing systems ("CAD systems"), product lifecycle management ("PLM") systems, and similar systems, that manage data for products and other items (collectively, "Product Data Management" systems or PDM systems).

BACKGROUND OF THE DISCLOSURE

CAD and PLM systems are useful for designing and manufacturing products and for visualizing simulations. Improved systems are desirable.

SUMMARY OF THE DISCLOSURE

Various disclosed embodiments include methods for product data management and corresponding systems and computer-readable mediums. A method includes receiving and parsing a functional model to produce a functional model graph, and receiving and parsing a three-dimensional (3D) model that corresponds to the functional model to produce a 3D model graph. The method includes identifying a plurality of one-dimensional (1D) candidate components corresponding to the functional model graph and the 3D model graph. The method includes creating a 1D graph corresponding to the 1D candidate components, parameterizing the 1D components in the 1D graph, and generating a 1D model from the parameterized 1D components.

The foregoing has outlined rather broadly the features and technical advantages of the present disclosure so that those skilled in the art may better understand the detailed description that follows. Additional features and advantages of the disclosure will be described hereinafter that form the subject of the claims. Those skilled in the art will appreciate that they may readily use the conception and the specific embodiment disclosed as a basis for modifying or designing other structures for carrying out the same purposes of the present disclosure. Those skilled in the art will also realize that such equivalent constructions do not depart from the spirit and scope of the disclosure in its broadest form.

Before undertaking the DETAILED DESCRIPTION below, it may be advantageous to set forth definitions of certain words or phrases used throughout this patent document: the terms "include" and "comprise," as well as derivatives thereof, mean inclusion without limitation; the term "or" is inclusive, meaning and/or; the phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like; and the term "controller" means any device, system or part thereof that controls at least one operation, whether such a device is implemented in hardware, firmware, software or some combination of at least two of the same. It should be noted that the functionality associated with any particular controller may be centralized or distributed, whether locally or remotely. Definitions for certain words and phrases are provided throughout this patent document, and those of ordinary skill in the art will understand that such definitions apply in many, if not most, instances to prior as well as future uses of such defined words and phrases. While some terms may include a wide variety of embodiments, the appended claims may expressly limit these terms to specific embodiments.

BRIEF DESCRIPTION OF THE DRAWINGS

For a more complete understanding of the present disclosure, and the advantages thereof, reference is now made to the following descriptions taken in conjunction with the accompanying drawings, wherein like numbers designate like objects, and in which:

FIG. 1 illustrates a block diagram of a data processing system in which an embodiment can be implemented;

FIGS. 2A and 2B illustrate an example of synthesis of a 1D model simulation of a driven joint in accordance with disclosed embodiments;

FIGS. 3A-3F illustrate examples of models in accordance with disclosed embodiments;

DETAILED DESCRIPTION

Figure 3A:
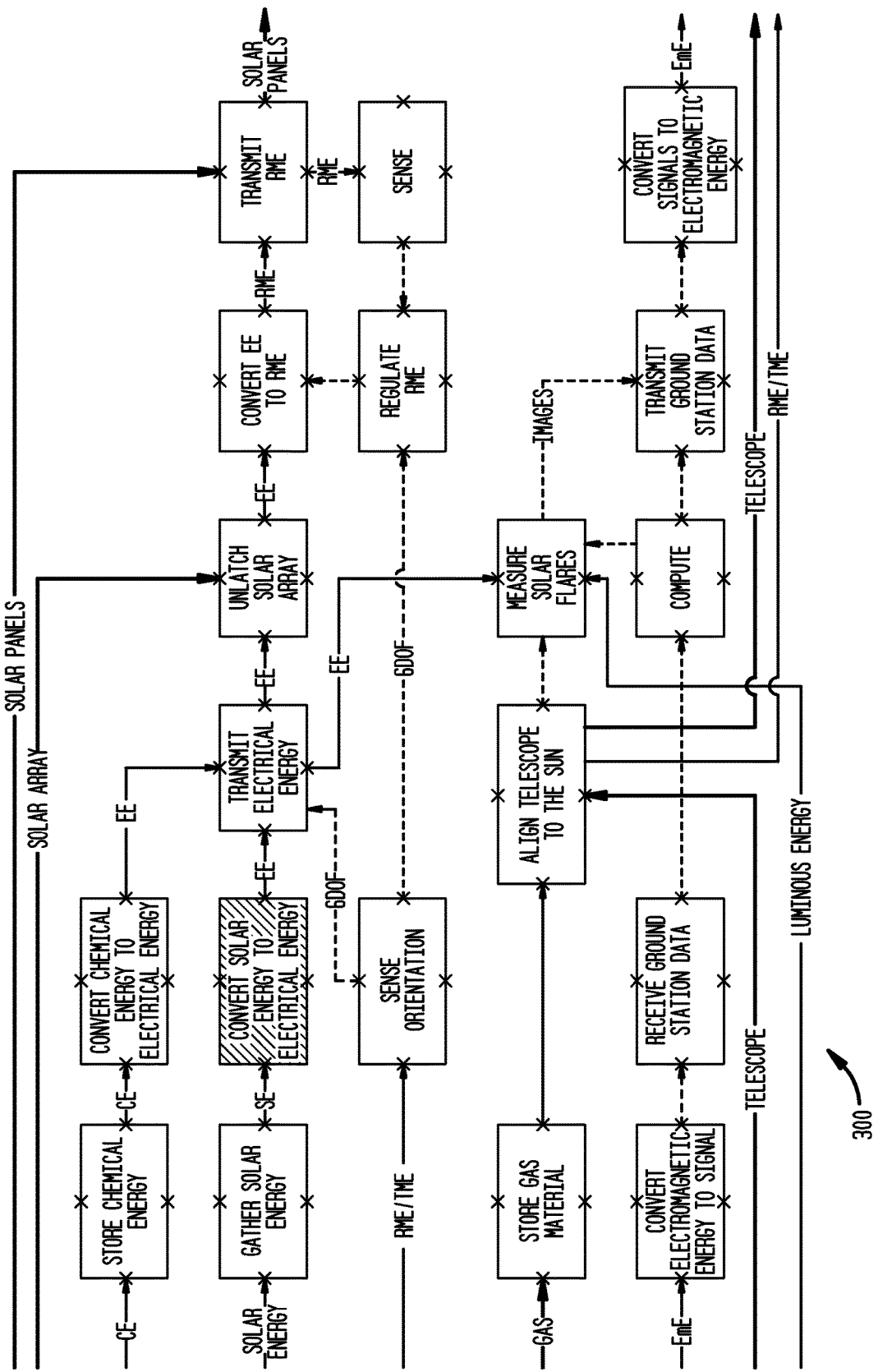

FIGS. 1 through 11B, discussed below, and the various embodiments used to describe the principles of the present disclosure in this patent document are by way of illustration only and should not be construed in any way to limit the scope of the disclosure. Those skilled in the art will understand that the principles of the present disclosure may be implemented in any suitably arranged device. The numerous innovative teachings of the present application will be described with reference to exemplary non-limiting embodiments.

Disclosed embodiments include a functional modeling-based approach for the synchronization and automatic code generation of three-dimensional (3D) and one-dimensional (1D) models. A 3D model generally represents a model of solid objects and their interactions, and a 1D model is generally a mathematical representation of a component and its dynamic behavior in the physical world or its simulated environment. Disclosed embodiments emphasize the use of functions in functional models in a PLM system based on the observation that high-fidelity models created by various tools during the detail design phase have a common origin in functional models created during the concept design phase.

Disclosed embodiments can load 3D models and automatically generate equivalent 1D models that are complete and can be compiled and simulated. Disclosed processes can not only synthesize equivalent models but also enable a design-space exploration of alternative designs influenced by the design rationale specified in the functional model. Disclosed embodiments include a fully automatic tool that relates 3D and 1D models through functionality and allows automatic code generation, synchronization of parameters, and design space exploration of design alternatives.

Synchronizing high-fidelity models is challenging. For example, a CAD model is a 3D geometric representation that defines the shape and material composition but does not contain any explicit information about other physical parameters; however, geometry and material composition may also determine the control, mass, thermal, electrical parameters for other high-fidelity models of the product represented in other tools. Updates to the geometric model represent updates in the other models, and vice versa. This brittle relationship between high-fidelity models is exacerbated by the presence of multiple engineering tools. Clearly, maintaining a custom synchronization mechanism for every pair of tools is not ideal. Maintaining a central repository to synchronize all tools is a better approach but it requires that all models expose a sufficiently granular level of detail for experts to define and enforce parameter relationships. The engineering of highly integrated complex systems of the future will require high-fidelity models to be annotated with additional semantics not only to better express what parts and assemblies they represent, but also to be more easily integrated and tested as part of a larger system using system-level simulation technology.

FIG. 1 illustrates a block diagram of a data processing system in which an embodiment can be implemented, for example as a CAD or PDM system particularly configured by software or otherwise to perform the processes as described herein, and in particular as each one of a plurality of interconnected and communicating systems as described herein. The data processing system depicted includes a processor 102 connected to a level two cache/bridge 104, which is connected in turn to a local system bus 106. Local system bus 106 may be, for example, a peripheral component interconnect (PCI) architecture bus. Also connected to local system bus in the depicted example are a main memory 108 and a graphics adapter 110. The graphics adapter 110 may be connected to display 111.

Other peripherals, such as local area network (LAN)/Wide Area Network/Wireless (e.g. WiFi) adapter 112, may also be connected to local system bus 106. Expansion bus interface 114 connects local system bus 106 to input/output (I/O) bus 116. I/O bus 116 is connected to keyboard/mouse adapter 118, disk controller 120, and I/O adapter 122. Disk controller 120 can be connected to a storage 126, which can be any suitable machine usable or machine readable storage medium, including but not limited to nonvolatile, hard-coded type mediums such as read only memories (ROMs) or erasable, electrically programmable read only memories (EEPROMs), magnetic tape storage, and user-recordable type mediums such as floppy disks, hard disk drives and compact disk read only memories (CD-ROMs) or digital versatile disks (DVDs), and other known optical, electrical, or magnetic storage devices.

Also connected to I/O bus 116 in the example shown is audio adapter 124, to which speakers (not shown) may be connected for playing sounds. Keyboard/mouse adapter 118 provides a connection for a pointing device (not shown), such as a mouse, trackball, trackpointer, etc.

Those of ordinary skill in the art will appreciate that the hardware depicted in FIG. 1 may vary for particular implementations. For example, other peripheral devices, such as an optical disk drive and the like, also may be used in addition or in place of the hardware depicted. The depicted example is provided for the purpose of explanation only and is not meant to imply architectural limitations with respect to the present disclosure.

A data processing system in accordance with an embodiment of the present disclosure includes an operating system employing a graphical user interface. The operating system permits multiple display windows to be presented in the graphical user interface simultaneously, with each display window providing an interface to a different application or to a different instance of the same application. A cursor in the graphical user interface may be manipulated by a user through the pointing device. The position of the cursor may be changed and/or an event, such as clicking a mouse button, generated to actuate a desired response.

One of various commercial operating systems, such as a version of Microsoft Windows™, a product of Microsoft Corporation located in Redmond, Wash., may be employed if suitably modified. The operating system is modified or created in accordance with the present disclosure as described.

LAN/WAN/Wireless adapter 112 can be connected to a network 130 (not a part of data processing system 100), which can be any public or private data processing system network or combination of networks, as known to those of skill in the art, including the Internet. Data processing system 100 can communicate over network 130 with server system 140, which is also not part of data processing system 100, but can be implemented, for example, as a separate data processing system 100.

As described herein, disclosed embodiments can use a functional modeling approach to correlate complex systems' models at the structural and parameter level. Systems and methods can use a functional approach to synchronize high-fidelity complex systems' models managed by different tools. Such an approach exploits the common origin between high-fidelity models created during the detail design phase and functional models created earlier during the concept design phase. This functional information can be used to synchronize high-fidelity models and maintain a consistent set of product information across tools and engineers.

Functional models describe what the system does in a multi-disciplinary yet implementation-independent manner. Such models can provide a formal representation of requirements that engineers from different disciplines can use to communicate effectively. This communication aspect can be used to synchronize dissimilar high-fidelity engineering models.

Functional models are often available in other visual languages. For example, a functional model can be represented as a block-flow diagram in a product such as the MICROSOFT VISIO software product, a product of Microsoft Corporation located in Redmond, Wash. Such an example can use blocks to represent functions and display various connectors such as signal (dashed lines), material (bold lines), and energy (simple lines) flows. Various embodiments can be implemented as an application that can be executed as an open DLL that imports functional models in a diagramming software product such as MICROSOFT VISIO into a 3D model in a CAD software product such as the NX software products by Siemens Product Management Lifecycle Software Inc., Plano, Tex. The 3D models can then be synchronized with a corresponding 1D simulation model in a product such as the AMESIM commercial simulation software by LMS International.

Design Space Exploration (DSE) refers to the activity of discovering and evaluating design alternatives prior to the implementation of a system. DSE is useful during concept design because it enables rapid prototyping of design alternatives that can be simulated and profiled to understand the impact of design decisions in the overall system behavior; allows for optimization by comparing the performance of candidate design alternatives and narrowing down the design space to the final candidates for further detailed analysis; and reduces the complexity of system integration by finding valid assemblies and configurations that satisfy a set of design constraints.

Disclosed embodiments treat functions as an integral part of the code generation when synthesizing 1D models from 3D models. To illustrate the usefulness of our approach we use the example of generating driven hinge joints. In this example, when a driven hinge joint is synthesized from a CAD system into a 1D model, a functional modeling-based code generator takes functions into account to expand the design space and perform an exploration of alternatives. In such an example, the driver of the pivot joint that is connected to a second port is selected by a joint-driver function. This function determines, by reading the functional model, the design intent and makes appropriate decisions.

FIGS. 2A and 2B illustrate an example of synthesis of a 1D model simulation of a driven joint. In FIG. 2A, a functional modeling compiler as described herein identifies that whenever a convert electrical energy to rotational mechanical energy, denoted as "Convert EE to RME," function is available, the design intention for the motion driver is to have an "Electric Motor" component. This comes from the knowledge that an electric motor is a logical component that "converts electrical energy to rotational mechanical energy". In this figure, a joint is illustrated in a CAD/3D form 202. The system can recognize a motion driver 204 and revolute joint 206. The system also recognizes a "convert EE to RME" function 208. The system builds a 1D model subgraph 210 that includes an electric motor component 212. Note that electrical information is not available in the original 3D model but is taken into consideration by a system as disclosed herein.

FIG. 2B illustrates an example where the functional modeling compiler identifies that a "Convert EE to RME" function and a store electrical energy, denoted as "Store EE," function are available in the functional model. In such a case, the system determines that the design intention for the motion driver is to have an "Electric Motor" supplied of electrical energy by a "Battery" that stores the energy. In this figure, a joint is illustrated in a CAD/3D form 222. The system can recognize a motion driver 224 and revolute joint 226. The system also recognizes functions 228 including a "convert EE to RME" function and a "Store EE" function. The system builds a 1D model subgraph 230 that includes an electric motor component 232 and a battery component 234.

Notice that in these examples, the port of motor 212 and 232 is a thermal port; however, thermal energy is not modeled in the functional model. The functional modeling compiler's responsibility is to complete the models whenever possible. In this example, an interface analysis on the Motor reveals that a thermal port is missing and the algorithm simply inserts a "Thermal Source" component.

Using functions as first-class citizens during the code generation of system-level simulations supports the design space exploration by adding variability to the possible solutions that exist. Various embodiments can present to the user the different solutions in an intuitive manner.

FIGS. 3A-3F illustrate examples of models in accordance with disclosed embodiments. FIG. 3A illustrates an exemplary functional model 300 of the Reuven Ramaty High Energy Solar Spectroscopic Imager (RHESSI) satellite in the form of a VISIO block-flow diagram. This model 300 consists of 19 functions and various signal (dashed lines), material (bold lines), and energy (simple lines) flows.

Using the functional model for the RHESSI satellite presented in FIG. 3A, the functional modeling compiler can generate a corresponding 1D model. FIG. 3B illustrates a 1D simulation model 305 corresponding to the functional model of FIG. 3A using a "Convert EE to RME" function. Model 305 can include both a component network and a legend of each of the components.

In this example, the "Convert EE to RME" influences the synthesis algorithm to select a "Motor" component and a set of "conversion between electric and signals" and "constants" as the motion driver for the motor as discussed above. Compared to the baseline model generated without functional information, this model includes two additional domains (electrical, thermal), and consists of twice as many simulation components. Clearly, the use of functional information helps the functional modeling compiler to synthesize higher-fidelity models.

FIG. 3C illustrates a 1D simulation model 310 corresponding to the functional model of FIG. 3A using a "Convert EE to RME" and a "Store EE" function. Model 310 can include both a component network and a legend of each of the components. This shows a synthesis example where the "Convert EE to RME" and "Store EE" functions are taken into consideration by the functional modeling compiler. The variation that is introduced by these two functions is a structure where a "Motor" component is supplied of electrical energy by a "Battery" component, as shown by batteries 312. The presence of batteries allows designers to analyze the system-level behavior of the system according to the design rationale specified by the functional model.

The selection of 1D components that fulfill a specific function, <Store EE, Battery> for example, is not arbitrary. A classification algorithm can use component libraries and extract functions from components through an interface, equational/algorithmic, structural, and parameter analysis. This semantic information is annotated in the library itself and the functional modeling compiler queries for all components that fulfill a specific function (e.g. "Store EE"). A heuristic algorithm can be used to narrow down the selection of the most appropriate choice(s).

A major advantage of having a functional model associated with a high-fidelity 1D model and a CAD/kinematic model is that the designers can perform analyses that are not possible using traditional models. For example, a "Battery" assembly in the a CAD model can also be associated with the "Store EE" function in a corresponding functional model. Representing functions in this manner allows the system to maintain consistency among different models in different tools and relate them through their functionality.

In some cases, a 1D model synthesized with the help of functions contains 8 batteries but the CAD model only contains one battery. This difference is important because a functional modeling compiler as disclosed herein is facilitating the DSE and although the CAD designer guessed that one battery shall be enough to supply energy to all motors, the reality may be different. In situations like this, the capabilities of 1D system-level simulation tools as disclosed herein are beneficial because the optimal configuration for the electrical subsystem can be studied rapidly. The disclosed functional modeling compiler is a valuable tool for this stage because it can automate the generation of high-fidelity 1D models from functional specifications.

The functional modeling compiler can also take into consideration the performance targets of the system. According to disclosed embodiments, the performance targets can be encoded as function parameters.

Figure 3D:
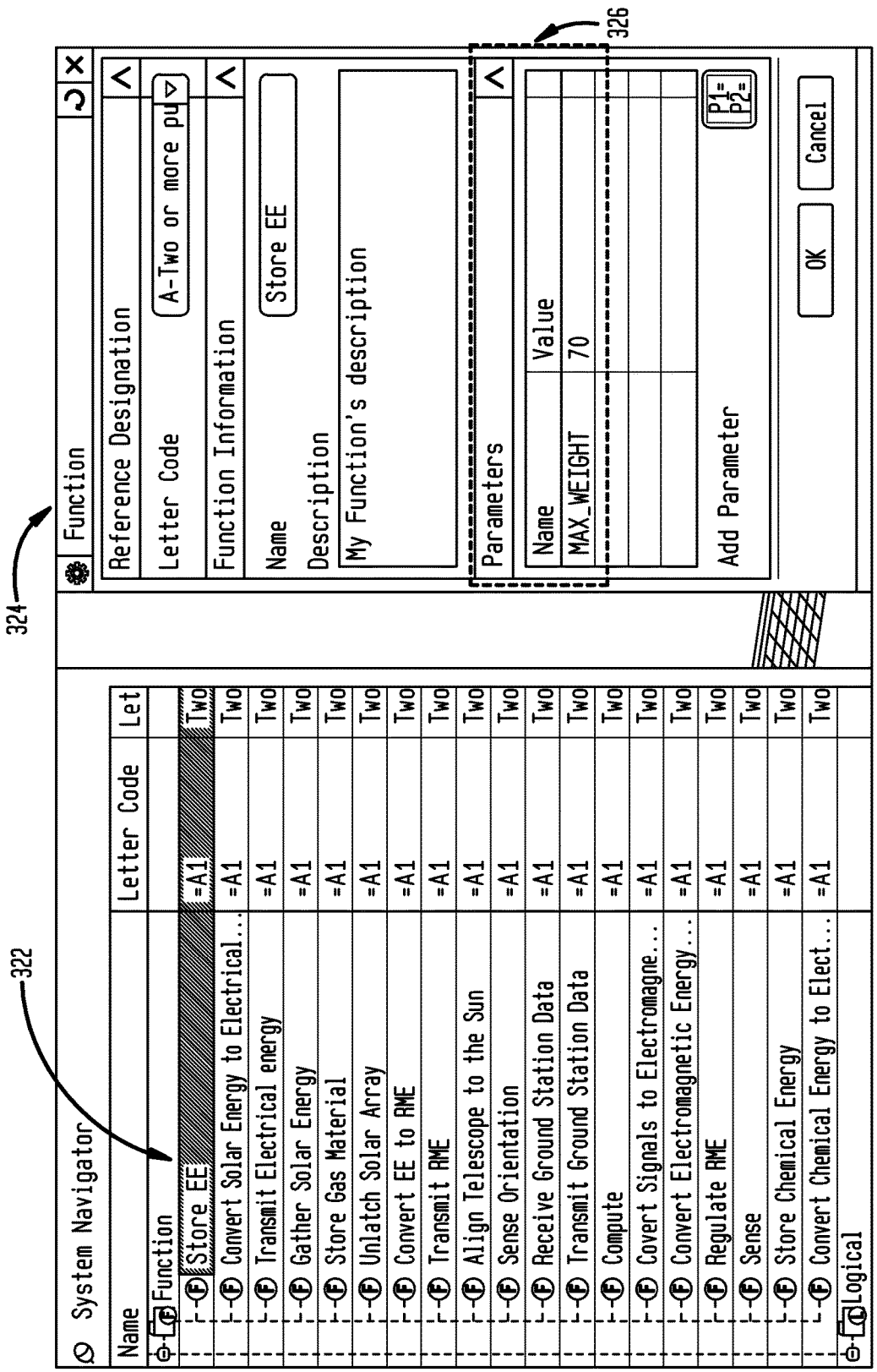

FIG. 3D illustrates a user interface for function parameters 324 for a function 322 in accordance with disclosed embodiments. These parameters can also be used during the automatic code generation of 1D models and to influence the selection of components. In other words, performance targets can affect the outcome of the code generation and 1D models generated with performance target parameters are possibly different than 1D models generated without performance targets. Therefore, performance targets, when used, provide an additional level of variability to the code generation.

FIG. 3D illustrates a system-level requirement for the "Store EE" function 322 specifying that the maximum allowed weight (MAX_WEIGHT) for this function shall be 70 kg, as shown by parameter 326. In various embodiments, these static requirements can be specified in the parameters section of the function elements.

In the example of FIG. 3D, the MAX_WEIGHT=70 kg constraint is used by the system to optimize the system configuration of the 1D models it generates. Because the "Store EE" function is also associated to the Battery assembly in the CAD model, the functional modeling compiler obtains the weight for the battery which is 61.8934 kg and the synthesized 1D model can only contain one battery in order to comply with the MAX_WEIGHT constraint for the "Store EE" function.

Figure 3E:
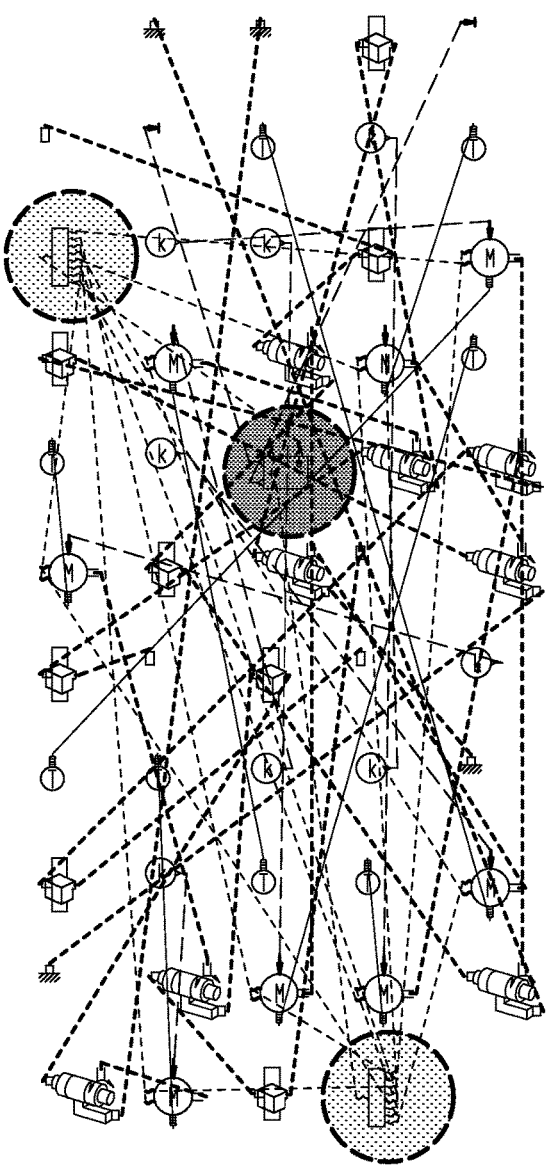

FIG. 3E illustrates a complete 1D model synthesized using performance targets leading to a design with a single battery 330. Notice that this example contains a single "Battery" component 330 and the electrical energy is routed to the eight electric motors 332 through two "Electric Junction" components 334.

Figure 3F:
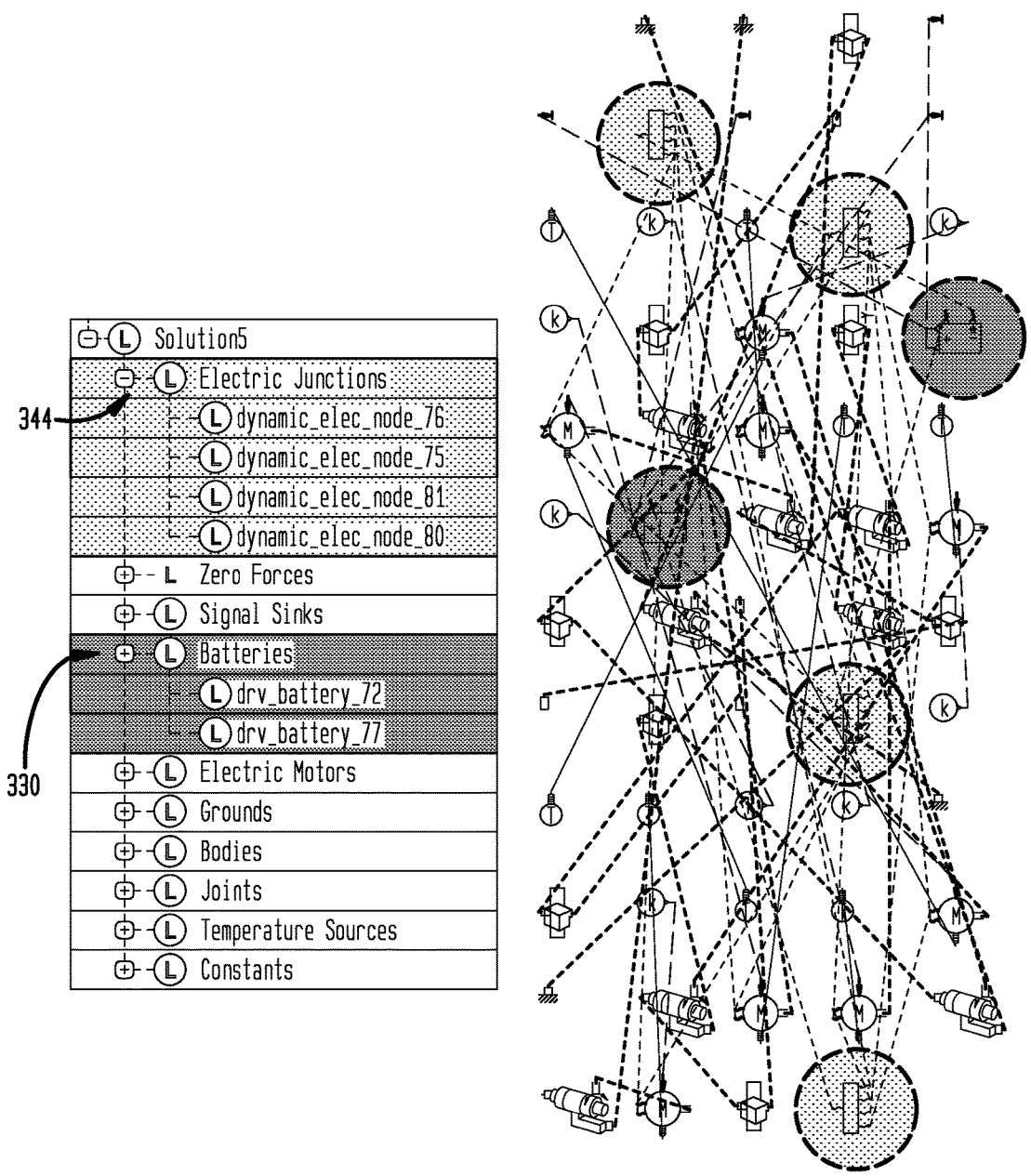

FIG. 3F shows a corresponding example where the MAX_WEIGHT system requirement is updated to 130 kg. The resulting 1D model has two batteries (61.8934 kg each) 330 and four electric junctions 344. A very important observation is that the 1D model is agnostic to the weight of the batteries and this parameter is irrelevant for obtaining a realistic simulation. However, the relationship of the functional model to 3D CAD and 1D models makes it possible to optimize the design to meet the system requirements.

The performance target examples illustrate that the design can be updated from the functional model in a top-down manner. However, a more common scenario with current PLM tools would be that the design is updated bottom-up. In other words, disclosed embodiments can construct 1D models where a 3D CAD geometry is updated, taking into account how any updates affect the overall design.

This capability can accommodate other changes as well. For example, assume that a CAD designer initiates a design change by increasing the height of the battery and therefore changes its weight from 61.8934 kg to 123.7868 kg. Assuming that the design requirement for the "Store EE" function is MAX_WEIGHT=130 kg, the functional modeling compiler correctly synthesizes a 1D model with a single "Battery" and two "Electric Junction" components. In other embodiments, the inverse scenario is also possible. A change in the 1D model can be propagated to CAD/kinematic models as long as there is a function in the functional model that relates the two elements.

In the PLM context, a design contract is an agreement between two or more people or tools that specify how two design elements relate to each other. Design contracts can be formal (e.g., models, architectures, interfaces) and informal (e.g. textual descriptions), and are used by tools and people to reason about the system's interdependencies. On the other hand, functional models are formal requirements created early in the design and capture the design intent of the entire system. Therefore, disclosed embodiments can leverage the system-level scope of functional models to use them as design contracts that begin when a new design is conceived, and propagate throughout the detail design phase where high-fidelity models are created. Thus, functional models become design contracts that can be used to synchronize dissimilar high-fidelity models. Establishing a design contract is a semi-automatic process because it requires two or more people to agree in a manual step first, and then the system automatically maintains this relationship.

Figure 4:
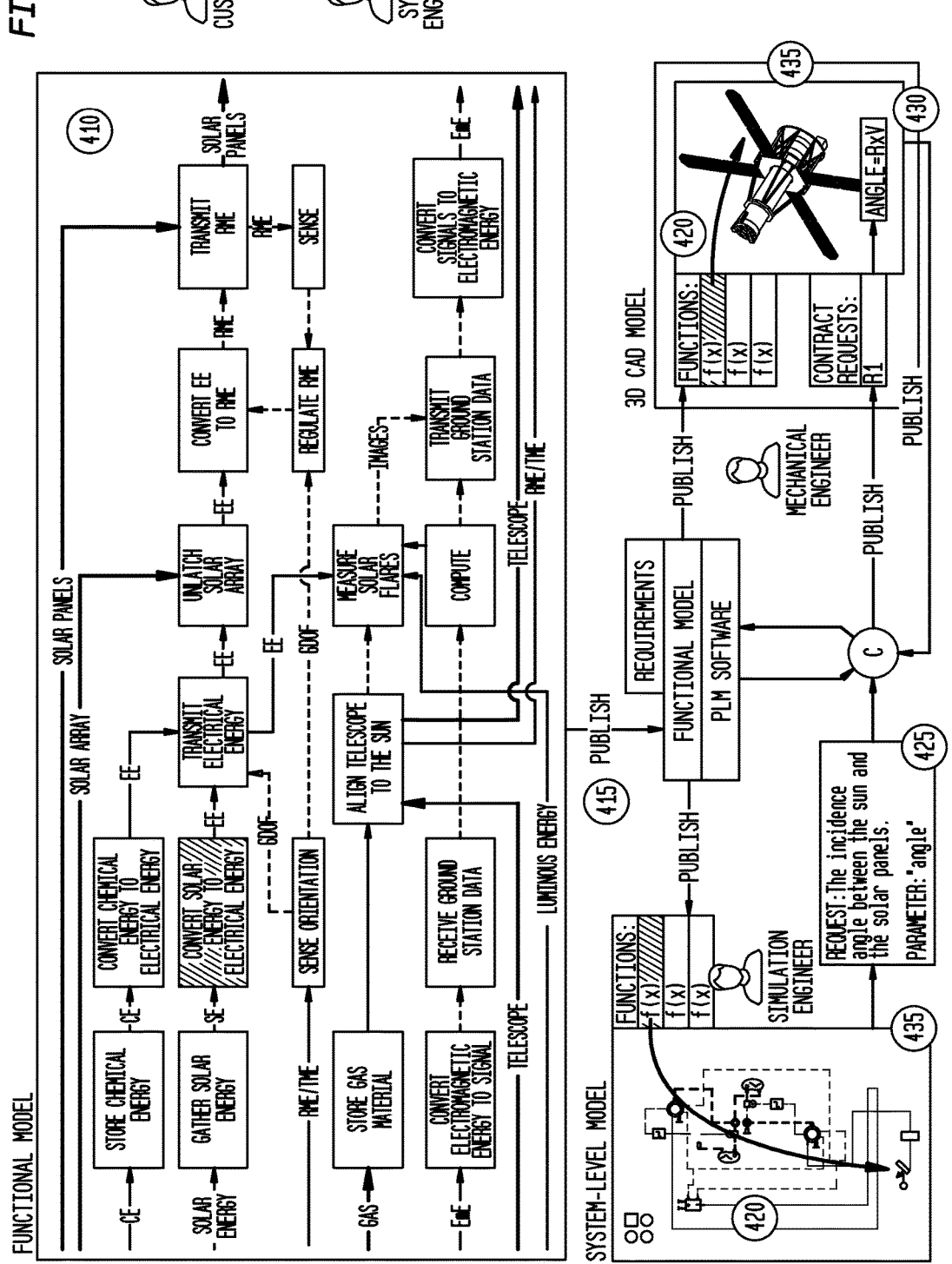
FIG. 4 illustrates a PLM workflow in accordance with disclosed embodiments.

FIG. 4 illustrates a PLM workflow in accordance with disclosed embodiments, shown as chronologically steps. At 405, the systems engineer gathers requirements from customers and regulatory agencies; these textual requirements are managed by the PLM software.

Requirements are then formalized by the systems engineer in in a functional model at 410. This functional model is the design rationale in terms of energy, material, and signal flows. In this example, the functional model describes the RHESSI satellite in terms of material flows (bold arrows such as Solar Array, Solar Panels, Telescope, Gas), energy flows (simple arrows including electrical energy, rotational mechanical energy, etc.), signal flows (dotted arrows such as 6DOF), and functions (blocks such as "Convert Solar Energy to Electrical Energy").

After the functional model is published in the PLM software and becomes visible to all engineers at 415, this concept provides the general guidelines for the detail design of the system. 415 also marks the transition between concept design and detail design phases.

Functional models also facilitate concurrent engineering. The creation of high-fidelity models at 420 can be done simultaneously by different engineers using domain-specific tools such as 3D CAD and 1D simulators. Similarly, other processes may be performed concurrently, such as gathering requirements 405 and creating high-fidelity models 420. Notice that 420 appears twice in FIG. 4, one represents the high-fidelity 3D CAD model created by the mechanical engineer, and the other represents the high-fidelity AMESim model created by the simulation engineer. Unfortunately, high-fidelity models created at this stage are typically not consistent with each other and therefore may not be able to be combined to analyze the system holistically. The reason is because different detail design tools use different numerical solvers that require very specific mathematical representations; high-fidelity models have the tendency to be intrinsically different. Nevertheless, establishing the relationships between two dissimilar high-fidelity models is desirable because it enables the possibility of maintaining these models in sync when a change occurs in any of the models, functions, or requirements.

A key mechanism of the functional approach to synchronization of models in accordance with some embodiments is illustrated at 405 and 420. Disclosed systems make the functions defined in the functional model available to detail design tools. These functions represent semantic information about the design intent that users can instantiate into their high-fidelity models using drag & drop functionality as shown in FIG. 4. The PLM software tracks all instantiations of the same function in different models and maintains a design contract that specifies how the design intent, or function, is represented in different high-fidelity models. In this example, the simulation engineer instantiates the 'convert solar energy" function in the "th_solar_radiation" component in the 1D model, and the mechanical engineer instantiates the same function in the solar panels of the 3D CAD model.

The system creates the relationship between the two components at 425 but this only represents half of the design contract because it does not specify how their mathematical descriptions relate to each other.

The completion of a design contract is initiated at 430. In this example, the simulation engineer initiates a request that contains a textual description of what is being asked for, who in the organization may provide this information, and a list of parameters that represent the formal interface of the design contract ("angle"). The PLM software uses the design contract information created at 425 to publish these incoming requests to other engineers in their own engineering environments. In this example, the mechanical engineer receives the request R1 for the incidence angle between the sun and the satellite.

Using the context provided by the common function (design intent), textual description, and interface description, the mechanical engineer writes an expression to provide the data that is being requested at 435, shown both in the 3D CAD model and the system-level 1D model. Notice that these expressions are tool-dependent in order to make the process more efficient by allowing the engineers to use the tools they are most familiar with. For example, the mechanical engineer uses a dot product on vectors to calculate the scalar value for the angle that is being requested for the 1D model. After the mechanical engineer completes the request and publishes an expression, the design contract is complete.

Design contracts in accordance with disclosed embodiments maintain high-fidelity models synchronized because changes in the 3D CAD model can be consistently reflected in the system-level model, and vice-versa. For example, a change in the solar panel dimensions in the 3D CAD model can be propagated to the area being exposed to the sun in the 1D model. Similarly, a change in the angle between the sun and the solar panel in the 1D simulation can change the orientation of the satellite with respect of the sun in the 3D CAD model.

State-of-the-art methods for generating 1D models from 3D models rely on fixed relationships that specify what 3D elements correspond to 1D elements. This leads to systems that are not flexible because the 1D models are always generated according to the same set of rules. Moreover, these rules are focused on mechanical aspects (because of the 3D models) and marginally treat other disciplines.

Disclosed embodiments add flexibility to the generation of 1D models from 3D models by adding functional models as an additional source of information that specifies the design intent in a multi-disciplinary manner as described herein. This approach provides flexibility to the generation of 1D models from 3D models because the resulting 1D models vary according to the specified functions. This causes the 1D models to use not a pre-defined set of rules, but potentially hundreds of thousands of rules. This enables two important aspects for the development of complex systems: design space exploration of alternatives that take into account many disciplines, and concurrent engineering by taking advantage of the synchronization of 3D, functional, and 1D objects as described herein.

Figure 5:
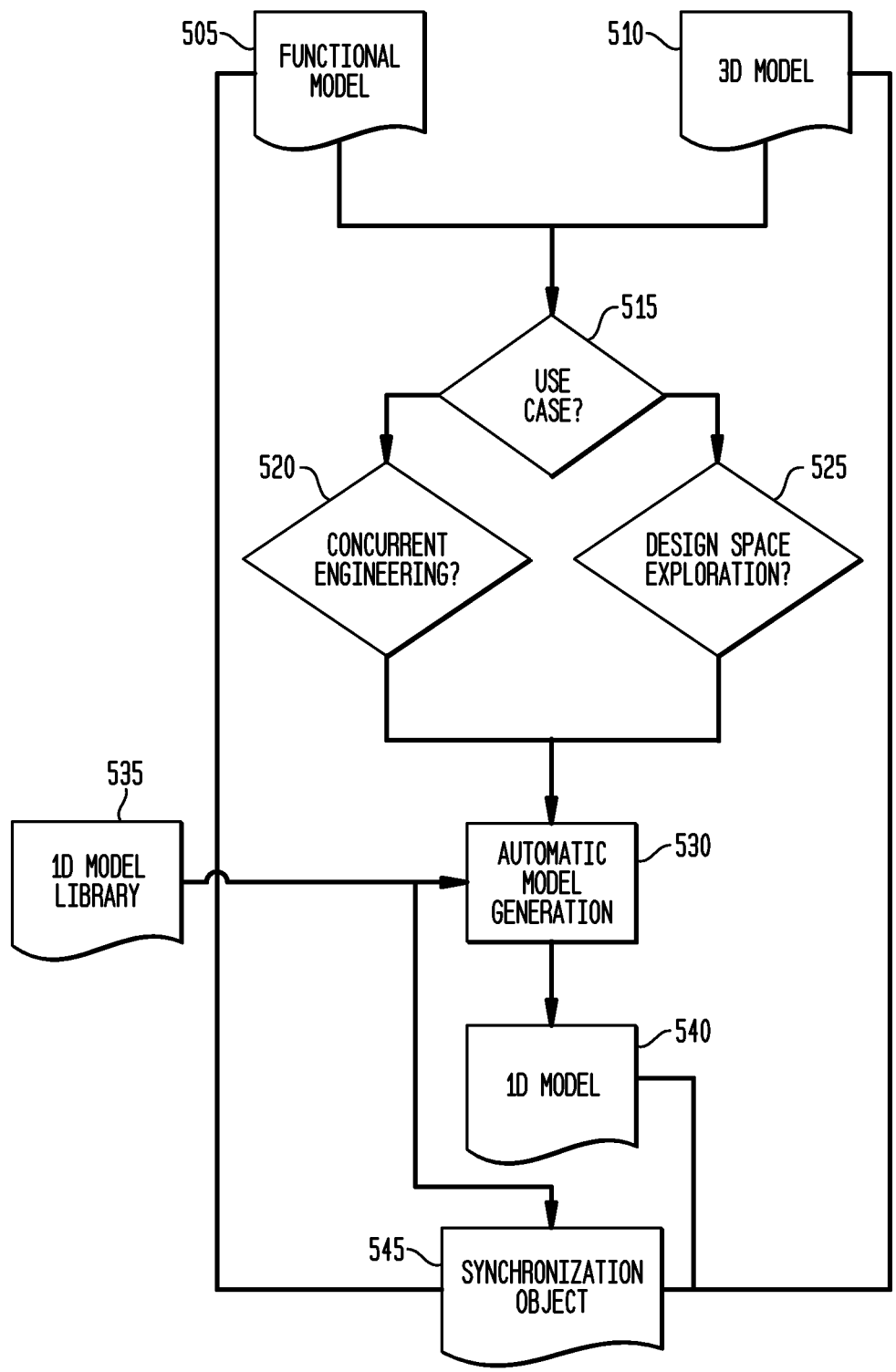
FIG. 5 illustrates the inputs, outputs, and a high-level process in accordance with disclosed embodiments.

FIG. 5 highlights the inputs, outputs, and a high-level process in accordance with disclosed embodiments. The three inputs are the functional model 505, the 3D model 510, and a 1D model library 535. The two most common use cases are the concurrent engineering 520 and design space exploration 525. Either use-case (and possibly others) calls an automatic model generation process 530 as described in detail herein. Such a process generates two outputs: the 1D model 540 and a synchronization object 545. The 1D model can be a single model or multiple models, and the synchronization object can be an entity that maintains a relationship between functions, 3D artifacts, and 1D artifacts.

Figure 6:
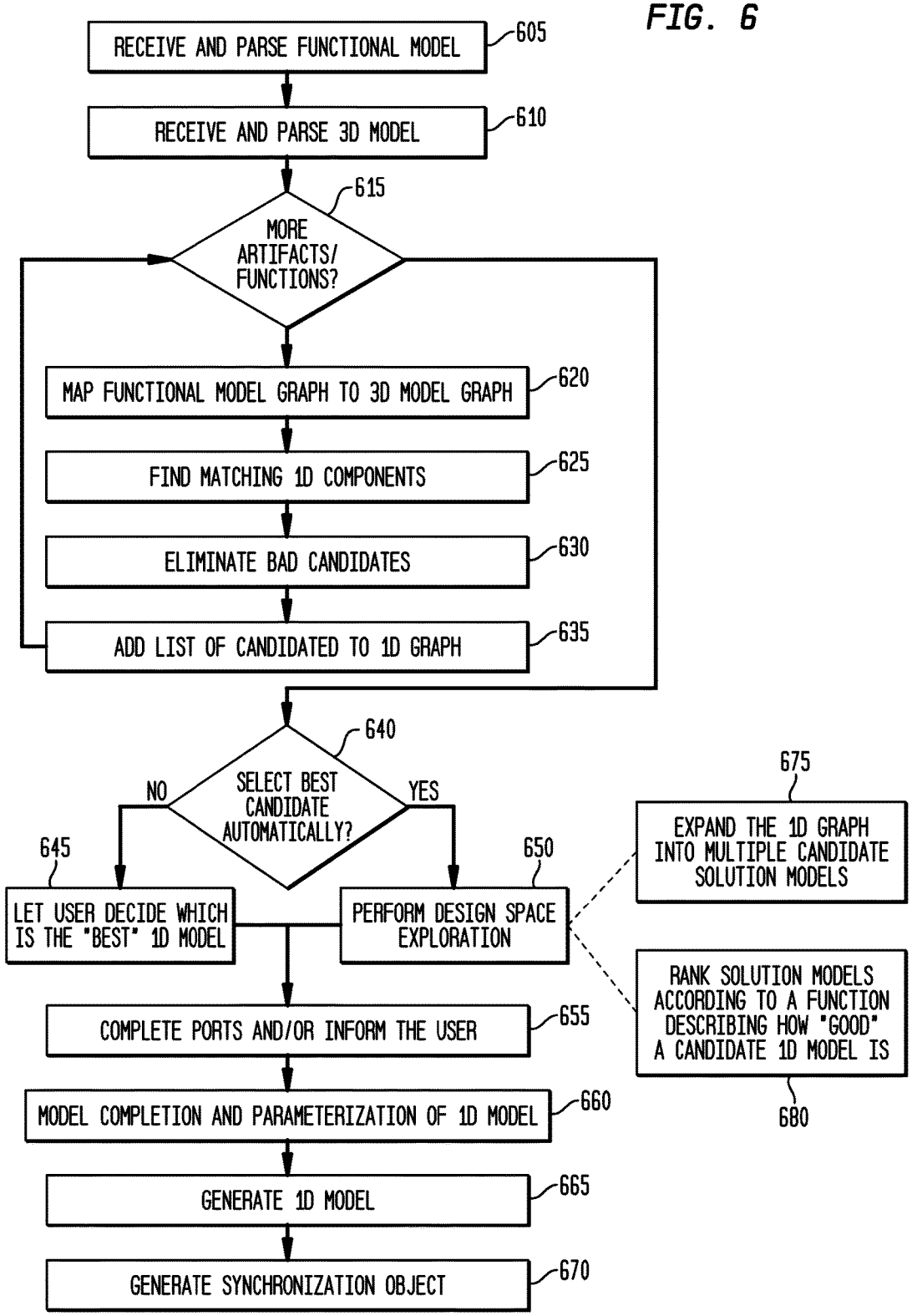
FIG. 6 illustrates a flowchart of a process in accordance with disclosed embodiments.

FIG. 6 illustrates a flowchart of a more detailed process in accordance with disclosed embodiments that may be performed, for example, by one or more PLM or PDM systems, referred to generically as the "system" below.

The system receives and parses a functional model to produce a functional model graph (605). Receiving, as used herein, can include loading from storage, receiving from another device or process, receiving via an interaction with a user, or otherwise. Parsing the functional model, in some embodiments, extracts the functional model as a labeled directed multigraph $F=(V, E, s, t, Lv, Le)$, where F represents the functional model, V represents the set of vertices/nodes, each of which is a function, and E represents the set of edges, each of which is a flow between functions. Each node $v_i$ is a function in this model, each edge $e(i, j)$ represents the flow from $v_i$ to $v_j$, $s:E \rightarrow V$ and $t:E \rightarrow V$ are two mappings indicating the source and target v in V of an e in E. Each function v in V and each flow e in E have uniquely assigned labels $l(v)$ in $L_V$ and $l(e)$ in $L_E$ using the vocabulary from a functional modeling taxonomy such as the Functional Basis Language known to those of skill in the art. Similar graphs are described in United States Patent Publication US 2014/0019104 A1, hereby incorporated by reference.

This functional-model parsing process can also extract the requirements R associated with the functional model. R is a set of requirements that determine the expected system's performance.

The system receives and parses a 3D model corresponding to the functional model to produce a 3D model graph (610). Parsing the 3D model, in some embodiments, produces a structural graph where nodes represent 3D artifacts such as bodies, joints, controllers, sensors, and actuators; and edges represent relationships between these artifacts. Geometric, kinematic, and dynamic elements can be encoded in the graph as attributes.

Figure 7A:
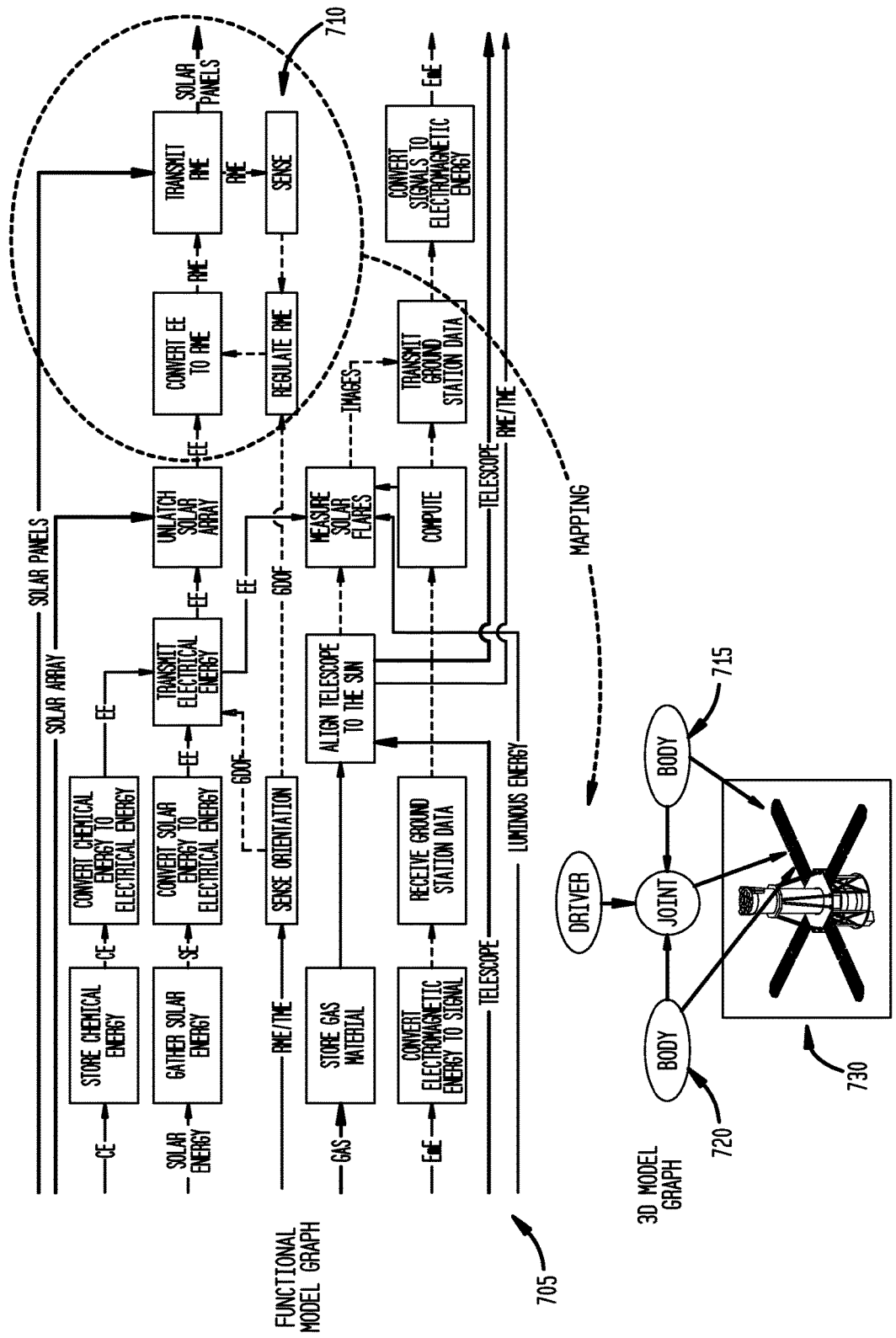
FIG. 7A illustrates mapping between a functional model graph and a 3D model graph in accordance with disclosed embodiments.

All the artifacts in the 3D model and all the functions in the functional model are processed by a loop as illustrated at 615-635. For each artifact Ai in the 3D model and function F in functional model (615), the system will map the functional model graph into the 3D model graph (620). This is not necessarily a complete mapping (e.g. all nodes and edges in one graph are mapped entirely to the other graph) but can be a partial mapping. FIG. 7A illustrates mapping between a functional model graph 705 and a 3D model graph 720 in accordance with disclosed embodiments. FIG. 7A illustrates how the subgraph in the functional model graph is partially mapped to a subgraph in the 3D model graph, including each of the functions 710 and artifacts 715. 3D model graph 720 corresponds to the 3D model 730. The system performs this matching by analyzing the types of nodes and edges. When there are no other artifacts or functions to be processed, the process continues at 640.

For example, a material flow in the functional model may map to the corresponding bodies nodes in the 3D graph. Edges in the functional model can map to nodes and/or edges in the 3D graph and vice versa. Similarly, a driver node emitting rotational motion in a 3D graph model can be mapped to Convert EE to RME, Regulate RME, Sense RME, Transmit RME, and RME (Rotational Mechanical Energy) functions and flows in the functional model.

After building the relationships between the functional model and the 3D model, the system finds all the 1D components in a 1D model library whose physical structure (port types, mathematical and physical equations) and functionality matches the elements in the 3D model/graph and the functional model/graph (625). The 1D Model Library includes functional classification of 1D components, and can be queried for what functions a component fulfills.

Figure 7B:
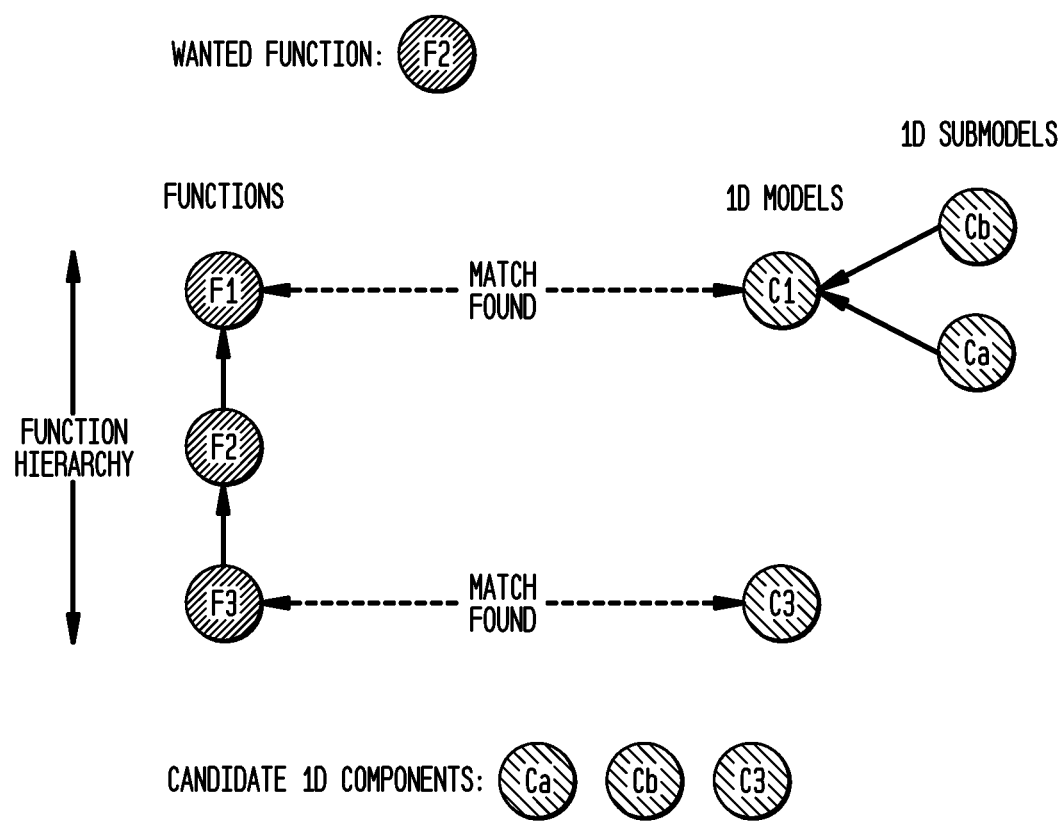
FIG. 7B illustrates an example of a 1D function search in accordance with disclosed embodiments.

FIG. 7B illustrates an example of a 1D function search in accordance with disclosed embodiments. Assume, in this case, that the wanted function F2 appears in the functional model. The system queries the 1D model library for all the components that fulfill F2 but no matches are found. Rather than stopping the automatic model generation, the system searches for 1D components that may not directly fulfill F2, but they fulfill higher-order (F1) or lower-order (F3) functions that are known to be related to F2. As a result, there are three candidate components Ca, Cb, and C3. The identified 1D component candidates are further scrutinized according to a quantitative and/or qualitative function that describes how good a candidate is.

The system eliminates all the components that do not fulfill the specified criteria from the list of candidates (630). This criteria can be, for example, performance, cost, reliability, failure rates, or simple preference, among others.

The system adds the list of identified candidates to the 1D graph (635). The 1D graph can be an undirected multigraph where nodes represent logical components. The identified list of candidates per logical component can be added to every node. The process can return to 615 for any other artifacts or functions.

Figure 8:
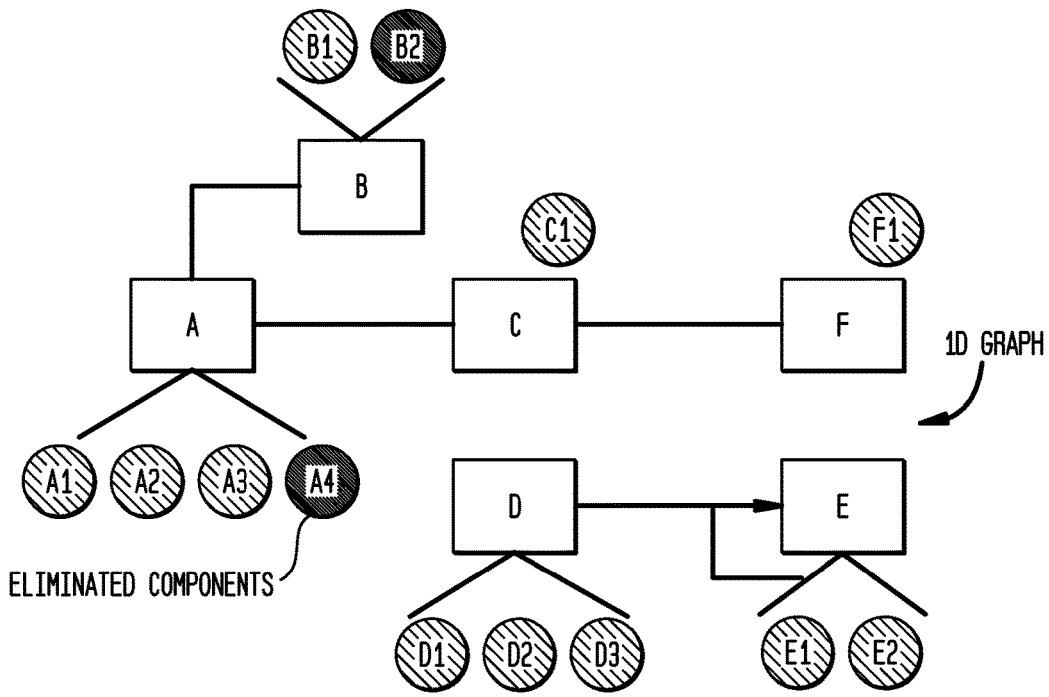
FIG. 8 illustrates a 1D graph in accordance with disclosed embodiments.

FIG. 8 illustrates how the 1D graph can be created and the list of candidates (shown as circles) is attached to every node (shown as rectangles) in accordance with disclosed embodiments. The elimination of components is represented by the black circles. In this example, components A4 and B2 are not added to the 1D graph and therefore are not considered as components of potential solutions.

The system can select the best possible solution for the 1D model automatically or with the guidance from the user (640). The best solution includes the combination of candidate components that produces a solution that most closely matches a criteria. There are cases where the user has already a solution in mind and the system provides the freedom to the user to select the "best" 1D model (645). The other option is for the system to automatically perform a design space exploration (650) and suggest a list of ranked solutions (from the "best" to the "worst").

Figure 9:
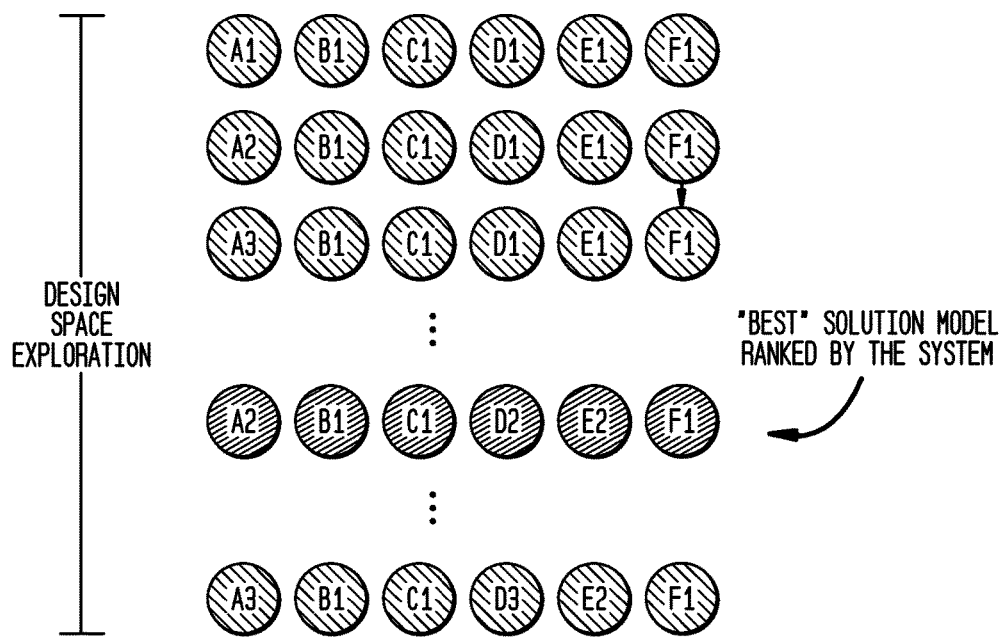
FIG. 9 illustrates the expanded design space exploration in accordance with disclosed embodiments.

When the system performs automatic design space exploration, there are two processes. The system will expand the 1D graph into the multiple candidate solution models (675). FIG. 9 illustrates the expanded design space for the given example. Notice that all possible combinations of the candidates (shown as circles) are considered.

Using the specified criteria, the system ranks the solutions and presents these suggestions to the user (680). This design space exploration step automatically builds alternative 1D designs of the same system for the user. This is useful for performing trade studies or simply comparing and gaining insights on different solutions.

Although the 1D graph contains the main components, the relationship between functional, 3D, and 1D models is not one-to-one. This means that the 1D graph is generally a partial match to the functional and 3D graphs. Therefore, there may be unconnected ports, or missing components that are required to have a complete 1D model that can be simulated. The system therefore step connects unconnected ports and/or informs the user about these missing connections (655).

Connecting the unconnected ports in a 1D model typically requires adding additional 1D components that complete the model. These components are sources or sinks of energy, material, or signal flows such as constants, thermal and electrical sources, etc.

Figure 10A:
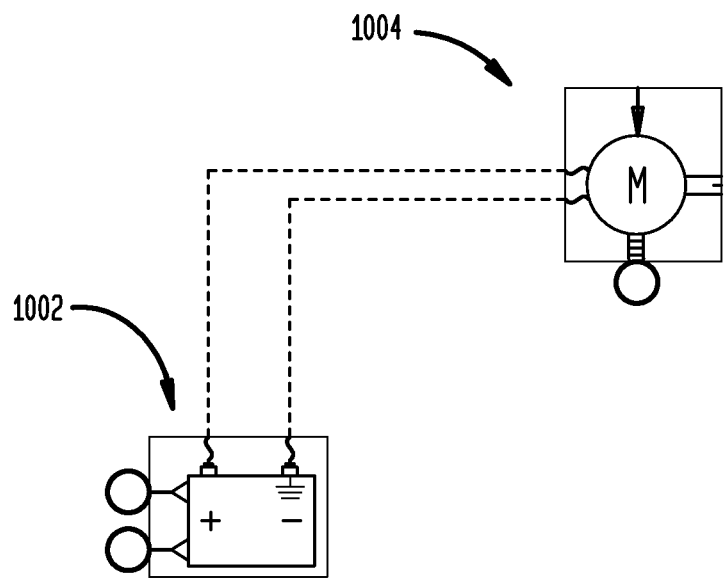
FIGS. 10A-10B illustrate automatic port editing in accordance with disclosed embodiments.
Figure 10B:
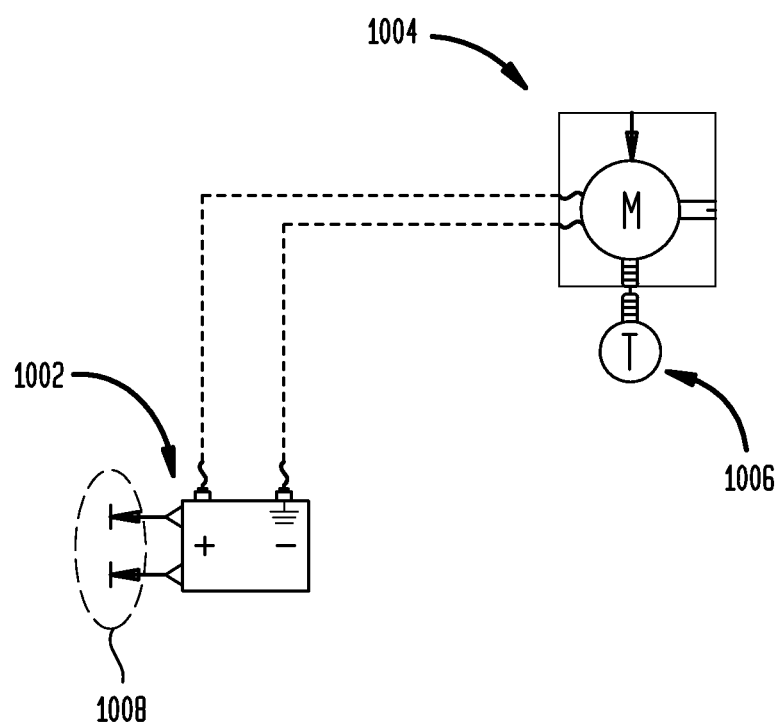

FIGS. 10A-10B illustrate automatic port editing. FIG. 10A shows a 1D model win unconnected ports and FIG. 10B shows a complete 1D model win connected ports and additional components. In the example of FIG. 10A, the battery 1002 and motor 1004 are connected with electric connections. However, there are three unconnected ports, shown with circles. FIG. 10B illustrates the resulting complete 1D model after two signal sink components are added to the unconnected ports of the battery 1002, as shown at 1008, and a thermal source 1006 is connected to the thermal port of the motor.

The system can also perform parameterization of the 1D models (660), such as by parameterizing each of the 1D components in the 1D graph as described for completion of the 1D models. Parameterization is used to accurately reproduce the environment and initial conditions of the 1D model that correspond to the 3D model and the functional information.

Figure 11A:
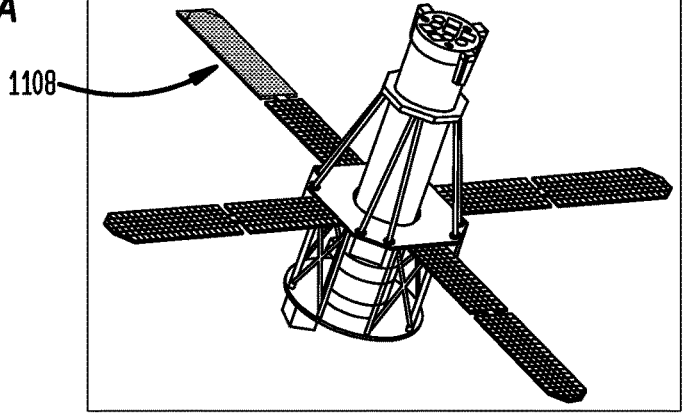
FIGS. 11A-11B illustrate parameterization of a 1D model in accordance with disclosed embodiments.
Figure 11B:
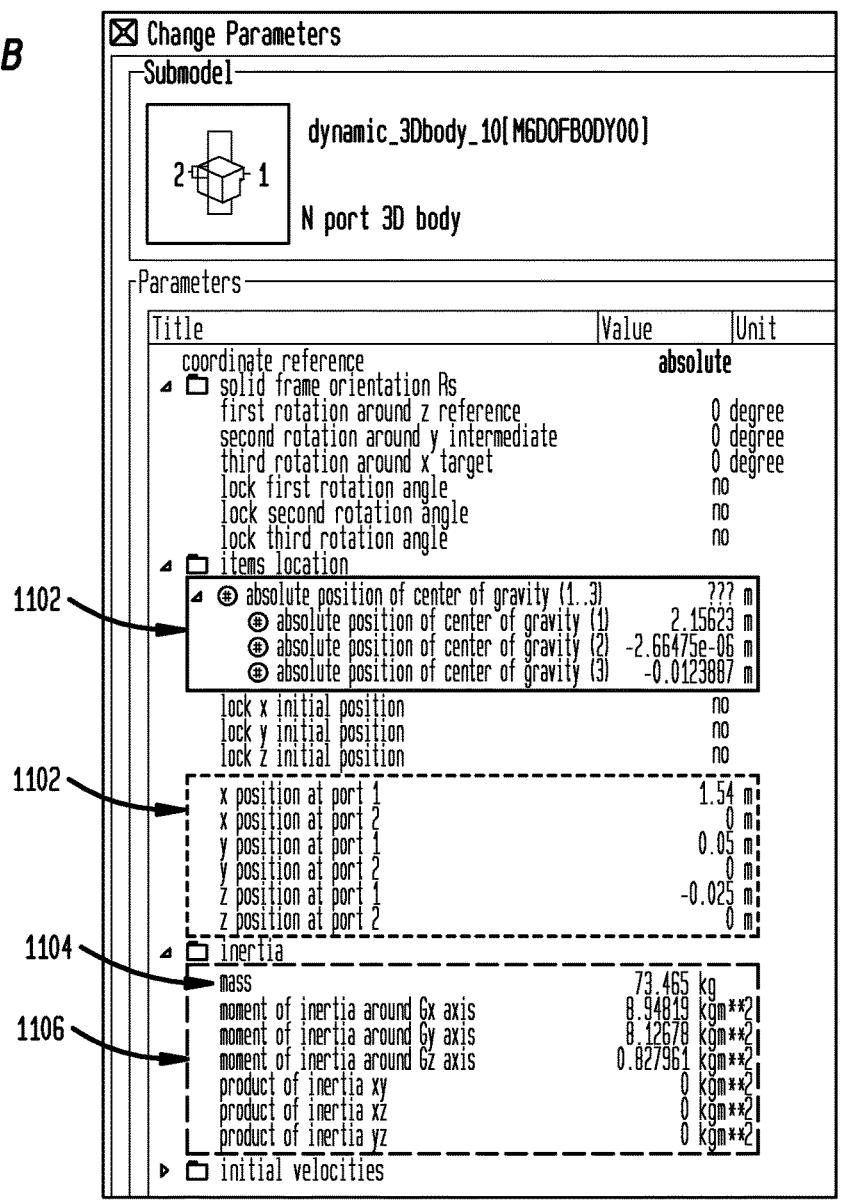

FIGS. 11A-11B illustrate parameterization of a 1D model in accordance with disclosed embodiments. FIG. 11A shows an original 3D model, and FIG. 11B shows an example of the parameterization of the 1D body artifact that corresponds to the speckled outer panel 1108 in a satellite 3D model of FIG. 11A. Notice that the 1D model component is parameterized according to the precise specifications of center of gravity at 1102, mass 1104, and moments of inertia 1106 extracted from the 3D model. Similarly, 1D models can be parameterized from functional information extracted from the functional model.

After the 1D models have been completed and parameterized, the system generates and stores the actual 1D model (665).

Finally, the system can generate a synchronization object according to the functional model, the 3D model, and the 1D model (670). The synchronization object can contain all the information of mappings, allocations, parameterization between functions in the input functional model, 3D artifacts in the 3D model, and 1D artifacts in the generated solutions in the 1D models. This synchronization object is useful for the integration of the various models in a PLM system.

Of course, those of skill in the art will recognize that, unless specifically indicated or required by the sequence of operations, certain steps in the processes described above may be omitted, performed concurrently or sequentially, or performed in a different order.

As described herein, various embodiments can use functions as "first-class citizens" in systems engineering and PLM tools. Functional models can be used as design contracts that specify which parameters and variables from high-fidelity models should be published by different tools to interact in a consistent manner. Disclosed embodiments can use a high-level semantic approach to synchronize dissimilar high-fidelity models. Geometric parameters, and also control, software, and multi-physics parameters can be synchronized among domain-specific tools.

Various embodiments can be implemented in a PLM system for synchronization of high-fidelity models using a functional approach, embodying the key capabilities such as synchronization of geometric, control, software, multi-physics parameters, semantic annotation of models, and publication of parameters.

Disclosed embodiments leverage a functional modeling aspect to model translation, where other systems do not consider a systems engineering approach to model transformation, synchronization, and code generation. Disclosed embodiments can use functions in a functional model to introduce variability to the model synthesis algorithms and this enables a design space exploration tool that complies with the design rationale and the system constraints.

Those skilled in the art will recognize that, for simplicity and clarity, the full structure and operation of all data processing systems suitable for use with the present disclosure is not being depicted or described herein. Instead, only so much of a data processing system as is unique to the present disclosure or necessary for an understanding of the present disclosure is depicted and described. The remainder of the construction and operation of data processing system 100 may conform to any of the various current implementations and practices known in the art.

It is important to note that while the disclosure includes a description in the context of a fully functional system, those skilled in the art will appreciate that at least portions of the mechanism of the present disclosure are capable of being distributed in the form of instructions contained within a machine-usable, computer-usable, or computer-readable medium in any of a variety of forms, and that the present disclosure applies equally regardless of the particular type of instruction or signal bearing medium or storage medium utilized to actually carry out the distribution. Examples of machine usable/readable or computer usable/readable mediums include: nonvolatile, hard-coded type mediums such as read only memories (ROMs) or erasable, electrically programmable read only memories (EEPROMs), and user-recordable type mediums such as floppy disks, hard disk drives and compact disk read only memories (CD-ROMs) or digital versatile disks (DVDs).

Although an exemplary embodiment of the present disclosure has been described in detail, those skilled in the art will understand that various changes, substitutions, variations, and improvements disclosed herein may be made without departing from the spirit and scope of the disclosure in its broadest form.

None of the description in the present application should be read as implying that any particular element, step, or function is an essential element which must be included in the claim scope: the scope of patented subject matter is defined only by the allowed claims. Moreover, none of these claims are intended to invoke paragraph six of 35 USC §112 unless the exact words "means for" are followed by a participle.

What is claimed is:

1. A method performed by a data processing system, comprising:
   receiving and parsing a functional model to produce a functional model graph, by the data processing system;
   receiving and parsing a three-dimensional (3D) model that corresponds to the functional model to produce a 3D model graph, by the data processing system;
   identifying a plurality of one-dimensional (1D) candidate components corresponding to the functional model graph and the 3D model graph, by the data processing system;
   creating a 1D graph corresponding to the 1D candidate components, by the data processing system;
   parameterizing the 1D components in the 1D graph, by the data processing system; and
   generating a 1D model from the parameterized 1D components, by the data processing system, including selecting a solution for the 1D model that includes a combination of 1D candidate components that most closely matches a criteria.

2. The method of claim 1, wherein the system also generates a synchronization object according to the functional model, the 3D model, and the 1D model.

3. The method of claim 1, wherein the system also maps the functional model graph to the 3D model graph.

4. The method of claim 1, wherein the system also eliminates at least one candidate component that does not fulfill specified criteria.

5. The method of claim 1, wherein the 1D candidate components are identified by matching physical structures of the candidate components to elements of the 3D model and functional model.

6. The method of claim 1, wherein the system also connects unconnected ports of the 1D model by adding additional 1D components.

7. A data processing system comprising:
   a processor; and
   an accessible memory, the data processing system particularly configured to:
   receive and parse a functional model to produce a functional model graph;
   receive and parse a three-dimensional (3D) model that corresponds to the functional model to produce a 3D model graph;
   identify a plurality of one-dimensional (1D) candidate components corresponding to the functional model graph and the 3D model graph;
   create a 1D graph corresponding to the 1D candidate components;
   parameterize the 1D components in the 1D graph; and
   generate a 1D model from the parameterized 1D components, in which a solution for the 1D model is selected that includes a combination of 1D candidate components that most closely matches a criteria.

8. The data processing system of claim 7, wherein the system also generates a synchronization object according to the functional model, the 3D model, and the 1D model.

9. The data processing system of claim 7, wherein the system also maps the functional model graph to the 3D model graph.

10. The data processing system of claim 7, wherein the system also eliminates at least one candidate component that does not fulfill specified criteria.

11. The data processing system of claim 7, wherein the 1D candidate components are identified by matching physical structures of the candidate components to elements of the 3D model and functional model.

12. The data processing system of claim 7, wherein the system also connects unconnected ports of the 1D model by adding additional 1D components.

13. A non-transitory computer-readable medium encoded with executable instructions that, when executed, cause one or more data processing systems to:
- receive and parse a functional model to produce a functional model graph;
- receive and parse a three-dimensional (3D) model that corresponds to the functional model to produce a 3D model graph;
- identify a plurality of one-dimensional (1D) candidate components corresponding to the functional model graph and the 3D model graph;
- create a 1D graph corresponding to the 1D candidate components;
- parameterize the 1D components in the 1D graph; and
- generate a 1D model from the parameterized 1D components, in which a solution for the 1D model is selected that includes a combination of 1D candidate components that most closely matches a criteria.

14. The computer-readable medium of claim 13, wherein the system also generates a synchronization object according to the functional model, the 3D model, and the 1D model.

15. The computer-readable medium of claim 13, wherein the system also maps the functional model graph to the 3D model graph.

16. The computer-readable medium of claim 13, wherein the system also eliminates at least one candidate component that does not fulfill specified criteria.

17. The computer-readable medium of claim 13, wherein the 1D candidate components are identified by matching physical structures of the candidate components to elements of the 3D model and functional model.

* * * * *